US012719435B2

(12) United States Patent
Wu et al.

(10) Patent No.: US 12,719,435 B2
(45) Date of Patent: Aug. 25, 2026

(54) FILTER, MANUFACTURING METHOD THEREOF AND ELECTRONIC APPARATUS

(71) Applicants: Beijing BOE Optoelectronics Technology Co., Ltd., Beijing (CN); BOE Technology Group Co., Ltd., Beijing (CN); Beijing BOE Technology Development Co., Ltd., Beijing (CN)

(72) Inventors: Yifan Wu, Beijing (CN); Yue Li, Beijing (CN); Yuelei Xiao, Beijing (CN); Qichang An, Beijing (CN); Huiying Li, Beijing (CN); Yingying Zhao, Beijing (CN); Can Zhang, Beijing (CN); Shuang Xu, Beijing (CN); Kuili Ren, Beijing (CN); Biqi Li, Beijing (CN)

(73) Assignees: Beijing BOE Optoelectronics Technology Co., Ltd., Beijing (CN); BOE Technology Group Co., Ltd., Beijing (CN); Beijing BOE Technology Development Co., Ltd., Beijing (CN)

( * ) Notice: Subject to any disclaimer, the term of this patent is extended or adjusted under 35 U.S.C. 154(b) by 279 days.

(21) Appl. No.: 18/709,265

(22) PCT Filed: Apr. 27, 2023

(86) PCT No.: PCT/CN2023/091132
§ 371 (c)(1),
(2) Date: May 10, 2024

(87) PCT Pub. No.: WO2024/221330
PCT Pub. Date: Oct. 31, 2024

(65) Prior Publication Data

US 2026/0163543 A1 Jun. 11, 2026

(51) Int. Cl.
*H03H 7/01* (2006.01)
*H03H 1/00* (2006.01)

(52) U.S. Cl.
CPC ... *H03H 7/0115* (2013.01); *H03H 2001/0085* (2013.01)

(58) Field of Classification Search
CPC . H03H 7/0115; H03H 7/09; H03H 2001/0085
See application file for complete search history.

(56) References Cited

U.S. PATENT DOCUMENTS

| | | | | |
|---|---|---|---|---|
| 2014/0104284 | A1* | 4/2014 | Shenoy | H01F 41/041 336/200 |
| 2020/0152537 | A1 | 5/2020 | Viljanen et al. | |

(Continued)

FOREIGN PATENT DOCUMENTS

| | | | |
|---|---|---|---|
| CN | 113782492 | A | 12/2021 |
| CN | 113949360 | A | 1/2022 |

(Continued)

*Primary Examiner* — Quan Tra
(74) *Attorney, Agent, or Firm* — Nath, Goldberg & Meyer; Joshua B. Goldberg

(57) ABSTRACT

A filter, a method for manufacturing a filter and an electronic apparatus are provided. The present disclosure belongs to field of passive device technology. The filter includes a dielectric substrate, at least one inductor and at least one capacitor on the dielectric substrate. The filter further includes a first auxiliary functional layer on a side of the dielectric substrate away from the second conductive structure of the inductor, the first auxiliary functional layer includes first and second accommodating portions penetrating through the first auxiliary functional layer in a thickness direction thereof, the first plate of the capacitor fills in the first accommodating portion, the first conductive structure of the inductor fills in the second accommodating portion, and surfaces of the first plate and the first conductive structure (Continued)

away from the dielectric substrate are flush with a surface of the first auxiliary functional layer away from the dielectric substrate.

20 Claims, 7 Drawing Sheets

(56) References Cited

U.S. PATENT DOCUMENTS

| | | | | |
|---|---|---|---|---|
| 2020/0321157 | A1 * | 10/2020 | Kawai .................. | H03H 7/0115 |
| 2021/0298172 | A1 * | 9/2021 | Onohara ............. | H01F 17/0013 |

FOREIGN PATENT DOCUMENTS

| | | | | | |
|---|---|---|---|---|---|
| CN | 114070222 | A | * | 2/2022 | ............. H03H 3/007 |
| CN | 114121929 | A | | 3/2022 | |
| CN | 114512337 | A | | 5/2022 | |
| CN | 114520222 | A | | 5/2022 | |
| JP | 2011155043 | A | | 8/2011 | |
| JP | 2018207036 | A | | 12/2018 | |
| WO | 2022222131 | A1 | | 10/2022 | |

* cited by examiner

FILTER, MANUFACTURING METHOD THEREOF AND ELECTRONIC APPARATUS

CROSS REFERENCE TO RELATED APPLICATION

This application is a National Phase Application filed under 35 U.S.C. 371 as a national stage of PCT/CN2023/091132, filed on Apr. 27, 2023, the contents of which are incorporated herein by reference in their entirety.

TECHNICAL FIELD

The present disclosure relates to the field of passive device technology, and in particular to a filter, a method for manufacturing a filter and an electronic apparatus.

BACKGROUND

Nowadays, the consumer electronics industry changes with each passing day, mobile communication terminals represented by mobile phones, particularly 5G mobile phones, are developing rapidly, the more and more frequency bands of signals are processed by the mobile phones, the required radio frequency chips are more and more, and the mobile phones are developing continuously towards a form enjoyed by consumers, including miniaturization, lightness and thinness and long battery life. In a traditional mobile phone, a large number of discrete devices, such as resistors, capacitors, inductors, filters and the like, are provided on a radio frequency PCB, and the discrete devices have the defects of large volume, high power consumption, multiple welding spots and large parasitic parameter change, and thus are difficult to meet future requirements. The interconnection, matching or the like among the radio frequency chips are required to be implemented by integrated passive devices with small area, high performance and good consistency. The integrated passive devices currently on the market are mainly Si (silicon) based substrates and GaAs (gallium arsenide) based substrates. The Si-based integrated passive device has the advantages of low price, but has a high microwave loss due to the fact that Si has trace impurities (poor insulation). Thus, the Si-based integrated passive device has the general performance. The GaAs-based integrated passive device has the excellent performance, but is expensive.

SUMMARY

The present disclosure is directed to at least one of the technical problems of the prior art, and provides a filter, a method for manufacturing a filter and an electronic apparatus.

An embodiment of the present disclosure provides a filter, including a dielectric substrate, at least one inductor and at least one capacitor integrated on the dielectric substrate, wherein the dielectric substrate includes a first connection via penetrating through the dielectric substrate in a thickness direction of the dielectric substrate, each of the at least one inductor includes a first conductive structure, a second conductive structure, and a first connection electrode, the first conductive structure and the second conductive structure are respectively located on two opposite sides of the dielectric substrate in the thickness direction of the dielectric substrate, the first connection electrode is in the first connection via, the first conductive structure is electrically connected to the second conductive structure through the first connection electrode to form a coil structure of each of the at least one inductor, each of the at least one capacitor includes a first plate and a second plate, the first plate and the first conductive structure are in a same layer, and the second plate is on a side of the first plate away from the dielectric substrate; and the filter further includes a first auxiliary functional layer on a side of the dielectric substrate away from the second conductive structure, the first auxiliary functional layer includes a first accommodating portion and a second accommodating portion penetrating through the first auxiliary functional layer in a thickness direction of the first auxiliary functional layer, the first plate fills in the first accommodating portion, the first conductive structure fills in the second accommodating portion, and a surface of each of the first plate and the first conductive structure away from the dielectric substrate is flush with a surface of the first auxiliary functional layer away from the dielectric substrate.

In an embodiment of the present disclosure, the first auxiliary functional layer is made of an inorganic insulating material.

In an embodiment of the present disclosure, the first auxiliary functional layer and the dielectric substrate have a one-piece structure.

In an embodiment of the present disclosure, the filter further includes a second auxiliary functional layer on a side of the dielectric substrate away from the first conductive structures, wherein the second auxiliary functional layer includes a third accommodating portion penetrating through the second auxiliary functional layer in a thickness direction of the second auxiliary functional layer, the second conductive structure fills in the third accommodating portion, and a surface of the second conductive structure away from the dielectric substrate is flush with a surface of the second auxiliary functional layer away from the dielectric substrate.

In an embodiment of the present disclosure, the second auxiliary functional layer is made of an inorganic insulating material.

In an embodiment of the present disclosure, the second auxiliary functional layer and the dielectric substrate have a one-piece structure.

In an embodiment of the present disclosure, the filter further includes a first interlayer dielectric layer between a layer on which the first plate is located and a layer on which the second plate is located, and a third auxiliary functional layer on a side of the first interlayer dielectric layer away from the dielectric substrate; wherein the third auxiliary functional layer includes a fourth accommodating portion penetrating through the third auxiliary functional layer in a thickness direction of the third auxiliary functional layer, the second plate fills in the fourth accommodating portion, and a surface of the second plate away from the dielectric substrate is flush with a surface of the third auxiliary functional layer away from the dielectric substrate.

In an embodiment of the present disclosure, the filter further includes a second interlayer dielectric layer on a side of the second plate of the capacitor away from the dielectric substrate, and a second connection electrode and a third connection electrode on a side of the second interlayer dielectric layer away from the dielectric substrate, wherein the second connection electrode is electrically connected to the inductor through a second connection via, and the third connection electrode is electrically connected to the second plate of the capacitor through a third connection via.

In an embodiment of the present disclosure, the filter further includes a first protective layer and a first planarization layer sequentially arranged on a side of the second connection electrode and the third connection electrode away from the dielectric substrate, a first connection pad electrically connected to the second connection electrode through a fourth connection via, and a second connection pad electrically connected to the third connection electrode through a fifth connection via, wherein the fourth connection via and the fifth connection via penetrate through the first protective layer and the first planarization layer.

In an embodiment of the present disclosure, the filter further includes a second protective layer and a second planarization layer sequentially arranged on a side of the second conductive structures away from the dielectric substrate.

In an embodiment of the present disclosure, the dielectric substrate includes a glass substrate.

An embodiment of the present disclosure provides a method for manufacturing a filter, including: providing a dielectric substrate, and integrating at least one inductor and at least one capacitor on the dielectric substrate, wherein the dielectric substrate comprises a first connection via penetrating through the dielectric substrate in a thickness direction of the dielectric substrate, and wherein the integrating at least one inductor and at least one capacitor on the dielectric substrate, includes: forming a first auxiliary functional layer on the dielectric substrate, wherein the first auxiliary functional layer includes a first accommodating portion and a second accommodating portion penetrating through the first auxiliary functional layer in a thickness direction of the first auxiliary functional layer; and forming a first connection electrode of each of the at least one inductor in the first connection via, forming a first conductive film layer on a side of the dielectric substrate away from the first auxiliary functional layer, polishing the first conductive film layer through a CMP process to form a first conductive structure of each of the at least one inductor and a first plate of each of the at least one capacitor, and forming a second conductive structure of each of the at least one inductor on a side of the dielectric substrate away from the first conductive structure; wherein the first conductive structure is electrically connected to the second conductive structure through the first connection electrode to form a coil structure of each of the at least one inductor, the first plate fills in the first accommodating portion, the first conductive structure fills in the second accommodating portion, and a surface of each of the first plate and the first conductive structure away from the dielectric substrate is flush with a surface of the first auxiliary functional layer away from the dielectric substrate.

In an embodiment of the present disclosure, the first auxiliary functional layer is made of an inorganic insulating material.

In an embodiment of the present disclosure, the first auxiliary functional layer and the dielectric substrate have a one-piece structure.

In an embodiment of the present disclosure, the method further includes forming a second auxiliary functional layer on a side of the dielectric substrate away from the first conductive structures, wherein the second auxiliary functional layer includes a third accommodating portion penetrating through the second auxiliary functional layer in a thickness direction of the second auxiliary functional layer, the second conductive structure fills in the third accommodating portion, and a surface of the second conductive structure away from the dielectric substrate is flush with a surface of the second auxiliary functional layer away from the dielectric substrate.

In an embodiment of the present disclosure, the second auxiliary functional layer is made of an inorganic insulating material.

In an embodiment of the present disclosure, the second auxiliary functional layer and the dielectric substrate have a one-piece structure.

In an embodiment of the present disclosure, forming the at least one capacitor further includes sequentially forming a first interlayer dielectric layer and a second plate on a layer on which the first plate is located, and the method further includes, prior to the forming the second plate: forming a third auxiliary functional layer on a side of the first interlayer dielectric layer away from the dielectric substrate, wherein the third auxiliary functional layer includes a fourth accommodating portion penetrating through the third auxiliary functional layer in a thickness direction of the third auxiliary functional layer, the second plate fills in the fourth accommodating portion, and a surface of the second plate away from the dielectric substrate is flush with a surface of the third auxiliary functional layer away from the dielectric substrate.

In an embodiment of the present disclosure, the method further includes forming a second interlayer dielectric layer on a side of the second plate of the capacitor away from the dielectric substrate, and forming a second connection electrode and a third connection electrode on a side of the second interlayer dielectric layer away from the dielectric substrate, wherein the second connection electrode is electrically connected to the inductor through a second connection via, and the third connection electrode is electrically connected to the second plate of the capacitor through a third connection via.

In an embodiment of the present disclosure, the method further includes sequentially forming a first protective layer and a first planarization layer on a side of the second connection electrode and the third connection electrode away from the dielectric substrate, wherein a first connection pad is electrically connected to the second connection electrode through a fourth connection via, and a second connection pad is electrically connected to the third connection electrode through a fifth connection via; and the fourth connection via and the fifth connection via penetrate through the first protective layer and the first planarization layer.

In an embodiment of the present disclosure, the method further includes sequentially forming a second protective layer and a second planarization layer on a side of the second conductive structures away from the dielectric substrate.

In an embodiment of the present disclosure, the dielectric substrate includes a glass substrate.

An embodiment of the present disclosure provides an electronic apparatus, which includes the filter in any one of the above embodiments.

DETAIL DESCRIPTION OF EMBODIMENTS

In order to enable one of ordinary skill in the art to better understand the technical solutions of the embodiments of the present disclosure, the present disclosure will be described in further detail with reference to the accompanying drawings and the detailed description.

Unless defined otherwise, technical or scientific terms used herein shall have the ordinary meaning as understood by one of ordinary skill in the art to which the present disclosure belongs. The terms "first", "second", and the like used in the present disclosure are not intended to indicate any order, quantity, or importance, but rather are used for distinguishing one element from another. Further, the term "a", "an", "the", or the like used herein does not denote a limitation of quantity, but rather denotes the presence of at least one element. The term "comprising", "including", or the like means that the element or item preceding the term contains the element or item listed after the term and its equivalent, but does not exclude other elements or items. The term "connected", "coupled", or the like is not limited to physical or mechanical connections, but may include electrical connections, whether direct or indirect connections. The terms "upper", "lower", "left", "right", and the like are used only for indicating relative positional relationships, and when the absolute position of an object being described is changed, the relative positional relationships may also be changed accordingly.

Figure 1:
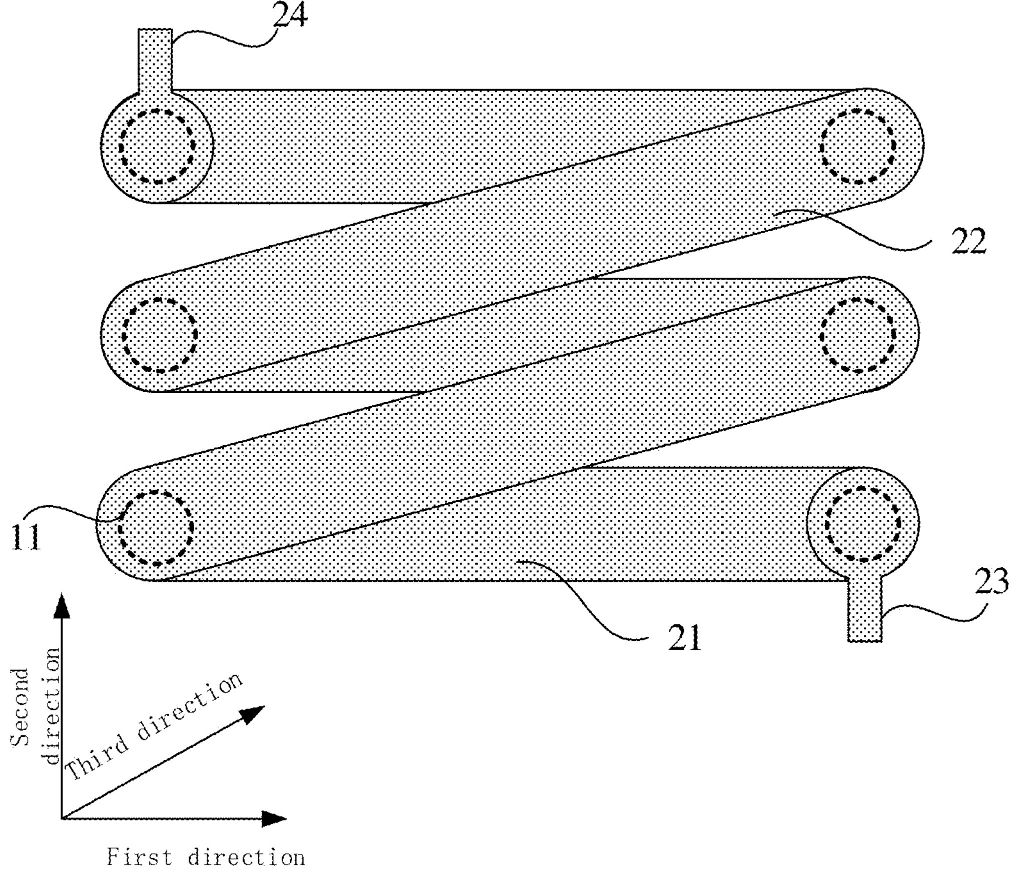
FIG. 1 is a top view of an inductor according to an embodiment of the present disclosure.

FIG. 1 is a top view of an inductor according to an embodiment of the present disclosure. Referring to FIG. 1, the inductor includes first conductive structures 21 extending along a first direction and arranged side by side along a second direction; second conductive structures 22 extending in a third direction and arranged side by side in the second direction. The first direction, the second direction and the third direction are different from each other. In the embodiment of the present disclosure, as an example, the first direction and the second direction are perpendicular to each other, and the first direction and the third direction intersect with each other and are non-perpendicular to each other for description.

Alternatively, the extending directions of the first conductive structures 21 and the second conductive structures 22 may be interchanged with each other, which is also within the protection scope of the embodiments of the present disclosure. In addition, in the present embodiment, as an example, the inductor includes N first conductive structures 21 and N−1 second conductive structures 22 for description, where $N \geq 2$, and N is an integer. Orthographic projections of a first terminal and a second terminal of each first conductive structure 21 on a first dielectric substrate at least partially overlap with orthographic projections of two first connection vias on the first dielectric substrate, respectively. The first terminal and the second terminal of each first conductive structure 21 correspond to two different first connection vias. That is, an orthographic projection of each first conductive structure 21 on the first dielectric substrate at least partially overlap with the orthographic projections of two first connection vias on the first dielectric substrate. At this time, the ith second conductive structure 22 of the inductor is connected to the first terminal of the ith first conductive structure 21 and the second terminal of the (i+1)th first conductive structure 21 through first connection electrodes 11 in the first connection vias to form an inductor coil, where $1 \leq i \leq N-1$, and i is an integer.

It should be noted that a first lead terminal 23 is connected to a second terminal of the 1st first conductive structure 21 of the inductor coil, and a second lead terminal 24 is connected to a first terminal of the Nth first conductive structure 21. Further, the first lead terminal 23 and the second lead terminal 24 may be disposed in the same layer and made of the same material as the second conductive structures 22. At this time, the first lead terminal 23 may be connected to the second terminal of the 1st first conductive structure 21 through a first connection electrode 11, and correspondingly, the second lead terminal 24 may be connected to the first terminal of the Nth first conductive structure 21 through a first connection electrode 11.

Figure 2:
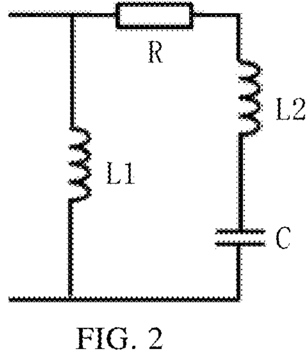
FIG. 2 is a circuit diagram of a filter.

FIG. 2 is a circuit diagram of a filter. As shown in FIG. 2, a circuit of the filter includes two inductors, one capacitor and one resistor. For convenience of understanding, the two inductors are referred to as a first inductor L1 and a second inductor L2, respectively. With continued reference to FIG. 2, a first lead terminal of the first inductor L1 is connected to a first terminal of the resistor R, a second lead terminal of the first inductor L1 is connected to a second plate of the capacitor C, a first lead terminal of the second inductor L2 is connected to a second terminal of the resistor R, and a second lead terminal of the second inductor L2 is connected to a first plate of the capacitor C.

It should be noted that the resistor R may be implemented by a wire, or a high-resistance material, such as indium tin oxide (ITO) or nickel chromium (NiCr) alloy. In the embodiment of the present disclosure, the material and the structure of the resistor R is not limited. The capacitor and the inductors will be mainly described below.

Figure 3:
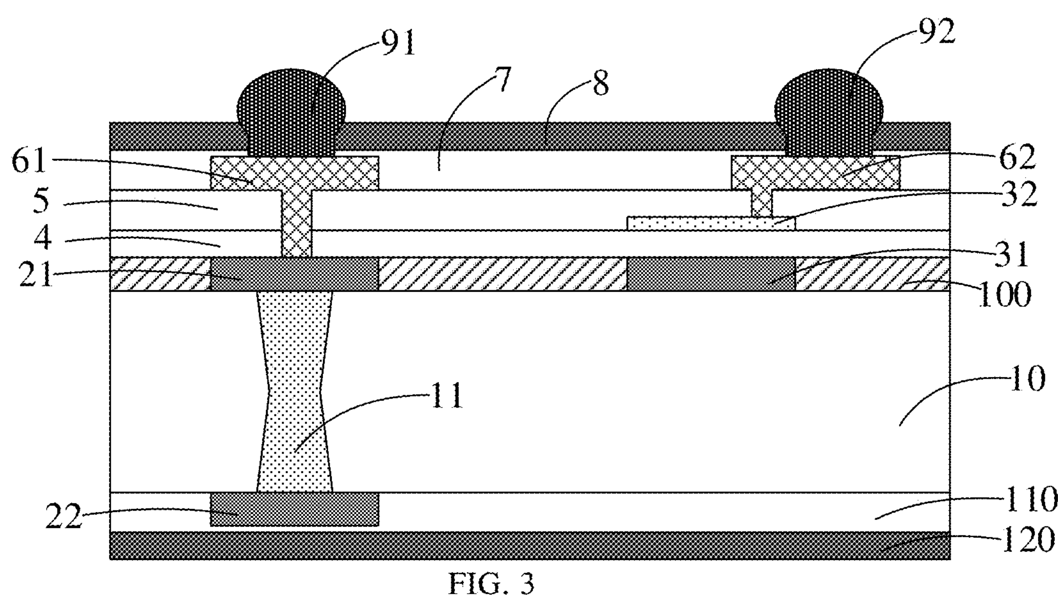
FIG. 3 is a cross-sectional view of a filter according to an embodiment of the present disclosure.

FIG. 3 is a cross-sectional view of a filter according to an embodiment of the present disclosure. As shown in FIG. 3, an embodiment of the present disclosure provides a filter, which includes a dielectric substrate 10, and at least one inductor and at least one capacitor integrated on the dielectric substrate 10. The dielectric substrate 10 is provided with first connection vias 101 penetrating through the dielectric substrate 10 in a thickness direction of the dielectric substrate 10, and the dielectric substrate 10 includes a first surface and a second surface oppositely arranged in the thickness direction of the dielectric substrate 10. Each inductor includes first conductive structures 21 disposed on the first surface of the dielectric substrate 10, second conductive structures 22 disposed on the second surface of the dielectric substrate 10, and first connection electrodes 11 disposed in the first connection vias 101. Each first conductive structure 21 is electrically connected to the corresponding second conductive structure 22 through the corresponding first connection electrode 11 to form a coil structure. A first plate 31 of each capacitor and each first conductive structure 21 of each inductor are disposed in the same layer and are made of the same material. For example, each first conductive structure 21 of each inductor is formed by electroplating a first seed layer, and each first plate 31 of each capacitor is formed by processing the first seed layer. A second plate 32 of each capacitor is located on a side of the first plate 31 away from the dielectric substrate 10, and a first interlayer dielectric layer 4 is arranged between the first plate 31 and the second plate 32 as a dielectric layer of the capacitor. Specifically, a first auxiliary functional layer 100 is disposed on the first surface of the dielectric substrate 10 according to the embodiment of the present disclosure, and is provided with a first accommodating portion 1001 and a second accommodating portion 1002 penetrating through the first auxiliary functional layer 100 in a thickness direction of the first auxiliary functional layer 100. The first plate 31 of the capacitor fills in the first accommodating portion 1001, the first conductive structure 21 of the inductor fills in the second accommodating portion 1002, and a surface of each of the first plate 31 and the first conductive structure 21 away from the dielectric substrate 10 is flush with a surface of the first auxiliary functional layer 100 away from the dielectric substrate 10.

It should be noted that in the embodiment of the present disclosure, as an example, the first conductive structure 21 of the inductor and the first plate 31 of the capacitor are formed by electroplating the first seed layer and are polished through a CMP (Chemical Mechanical Polishing) process.

In the embodiment of the present disclosure, the first auxiliary functional layer 100 is disposed on the first surface of the dielectric substrate 10, and is provided with the first accommodating portion 1001 and the second accommodating portion 1002 penetrating through the first auxiliary functional layer 100 in the thickness direction of the first auxiliary functional layer 100. At this time, a first conductive film layer is formed as the first seed layer after the first auxiliary functional layer 100 is formed, and then, the first seed layer is electroplated. At this time, the first seed layer fills in and protrudes from the first accommodating portion 1001 and the second accommodating portion 1002, and finally, with the first auxiliary functional layer 100 as a reference, the first seed layer (which has a rough surface) is polished through the CMP process, so as to form the first plate 31 of the capacitor and the first conductive structure 21 of the inductor. In this case, the surface of the first plate 31 of the capacitor is smooth, and the first interlayer dielectric layer 4 and the second plate 32 formed subsequently are also relatively smooth. Therefore, the uniformity of the capacitor can be effectively improved.

In some examples, not only the first auxiliary functional layer 100 is formed on the first surface of the dielectric substrate 10, but also a second auxiliary functional layer 200 is formed on the second surface of the dielectric substrate 10, and is provided with a third accommodating portion 2001 penetrating through the second auxiliary functional layer 200 in a thickness direction of the second auxiliary functional layer 200. The second conductive structure 22 of the inductor fills in the third accommodating portion 2001, and a surface of the second conductive structure 22 away from the dielectric substrate 10 is flush with a surface of the second auxiliary functional layer 200 away from the dielectric substrate 10. The second conductive structure 22 of the inductor is generally formed by a second seed layer through a patterning process, and has a rough surface, which affects the uniformity of the inductor. In an embodiment, the second auxiliary functional layer 200 is formed on the second surface of the dielectric substrate 10. At this time, with the second auxiliary functional layer 200 as a reference, the second seed layer is polished through the CMP process, so that a surface of the second conductive structure 22 of the inductor is smooth. Therefore, the uniformity of the inductor can be improved.

In some examples, not only the first auxiliary functional layer 100 and the second auxiliary functional layer 200 may be provided, but also a third auxiliary functional layer 300 may be formed on a side of the first interlayer dielectric layer 4 away from the dielectric substrate 10, and is provided with a fourth accommodating portion penetrating through the third auxiliary functional layer 300 in a thickness direction of the third auxiliary functional layer 300. The second plate 32 fills in the fourth accommodating portion, and a surface of the second plate 32 away from the dielectric substrate 10 is flush with a surface of the third auxiliary functional layer 300 away from the dielectric substrate 10. In this case, a third conductive film layer is formed on a side of the third auxiliary functional layer 300 away from the dielectric substrate 10, and then with the third auxiliary functional layer 300 as a reference, the third conductive film layer is polished through the CMP process to form the second plate 32 of the capacitor, so that a surface of the formed second plate 32 is smooth, and therefore, subsequently formed film layers are smooth.

The filter in the embodiment of the present disclosure will be described below in detail with reference to specific examples and a method for manufacturing a filter in the specific examples.

In a first example, as shown in FIG. 3, the filter includes the dielectric substrate 10, and at least one inductor and at least one capacitor integrated on the dielectric substrate 10.

The dielectric substrate 10 is provided with first connection vias 101 penetrating through the dielectric substrate 10 in a thickness direction of the dielectric substrate 10, and the dielectric substrate 10 includes a first surface and a second surface opposite to each other in the thickness direction of the dielectric substrate 10. Each inductor includes first conductive structures 21 disposed on the first surface of the dielectric substrate 10, second conductive structures 22 disposed on the second surface of the dielectric substrate 10, and first connection electrodes 11 disposed in the first connection vias 101. Each first conductive structure 21 is electrically connected to the corresponding second conductive structure 22 through the corresponding first connection electrode 11 to form a coil structure. A first plate 31 of each capacitor and each first conductive structure 21 of each inductor are disposed in the same layer and are made of the same material. A second plate 32 of each capacitor is located on a side of the first plate 31 away from the dielectric substrate 10, and a first interlayer dielectric layer 4 is arranged between the first plate 31 and the second plate 32 as a dielectric layer of the capacitor. A first auxiliary functional layer 100 is disposed on the first surface of the dielectric substrate 10, and is provided with a first accommodating portion 1001 and a second accommodating portion 1002 penetrating through the first auxiliary functional layer 100 in a thickness direction of the first auxiliary functional layer 100. The first plate 31 of the capacitor fills in the first accommodating portion 1001, the first conductive structure 21 of the inductor fills in the second accommodating portion 1002, and a surface of each of the first plate 31 and the first conductive structure 21 away from the dielectric substrate 10 is flush with a surface of the first auxiliary functional layer 100 away from the dielectric substrate 10. A second interlayer dielectric layer 5 is arranged on a side of the second plate 32 of the capacitor away from the dielectric substrate 10, and a second connection electrode 61 and a third connection electrode 62 are arranged on a side of the second interlayer dielectric layer 5 away from the dielectric substrate 10. The second connection electrode 61 is electrically connected to the inductor through a second connection via 51; the third connection electrode is electrically connected to the second plate 32 of the capacitor through a third connection via 52; the second connection via 51 penetrates through the first interlayer dielectric layer 4, the first auxiliary functional layer 100 and the second interlayer dielectric layer 5; the third connection electrode penetrates through the second interlayer dielectric layer 5. A first protective layer 7 and a first planarization layer 8 are provided on a side of a layer, where the second connection electrode 61 and the third connection electrode 62 are located, away from the dielectric substrate 10, and a first connection pad 91 and a second connection pad 92 are provided on a side of the first planarization layer 8 away from the dielectric substrate 10. The first connection pad 91 is electrically connected to the second connection electrode 61 through a fourth connection via 81, and the second connection pad 92 is electrically connected to the third connection electrode through a fifth connection via 82; the fourth connection via 81 and the fifth connection via 82 each penetrate through the first protective layer 7 and the first planarization layer 8. A second protective layer 110 and a second planarization layer 120 are sequentially disposed on a side of the second conductive structure 22 away from the dielectric substrate 10.

In some examples, the dielectric substrate 10 is a glass substrate. A thickness of the glass substrate is in a range from about 0.25 mm to about 0.3 mm.

In some examples, the first auxiliary functional layer 100, the first interlayer dielectric layer 4, and the second interlayer dielectric layer 5 may be inorganic insulating layers. For example: each of the first auxiliary functional layer 100, the first interlayer dielectric layer 4, and the second interlayer dielectric layer 5 is an inorganic insulating layer formed of silicon nitride ($SiN_x$), or an inorganic insulating layer formed of silicon oxide ($SiO_2$), or a film layer formed by combining several stacked layers of the inorganic insulating layer of $SiN_x$ and the inorganic insulating layer of $SiO_2$.

In some examples, materials of the first conductive structure 21, the second conductive structure 22, the first connection electrode 11, the second connection electrode 61, and the third connection electrode 62 include, but are not limited to, copper.

In some examples, the first connection pad 91 and the second connection pad 92 may be solder balls.

In some examples, the first protective layer 7 is used to prevent water and oxygen from invading the devices formed on the first surface of the dielectric substrate 10, and the second protective layer 110 is used to prevent water and oxygen from invading the devices formed on the second surface of the dielectric substrate 10. Thicknesses of the first protective layer 7 and the second protective layer 110 are both in a range from 0.4 μm to 0.6 μm; the first protective layer 7 and the second protective layer 110 may be made of an inorganic insulating material. For example: the first protective layer 7 and the second protective layer 110 may be an inorganic insulating layer formed of silicon nitride ($SiN_x$), or an inorganic insulating layer formed of silicon oxide ($SiO_2$), or a film layer formed by combining several stacked layers of the inorganic insulating layer of $SiN_x$ and the inorganic insulating layer of $SiO_2$. A material of the first planarization layer 9 and the second planarization layer 120 may include an organic insulating material including, for example, resin-based materials such as polyimide, epoxy, acryl, polyester, photoresist, polyacrylate, polyamide, siloxane, or the like. As another example, the organic insulating material includes an elastic material, such as urethane, Thermoplastic Polyurethane (TPU), or the like.

Figure 4:
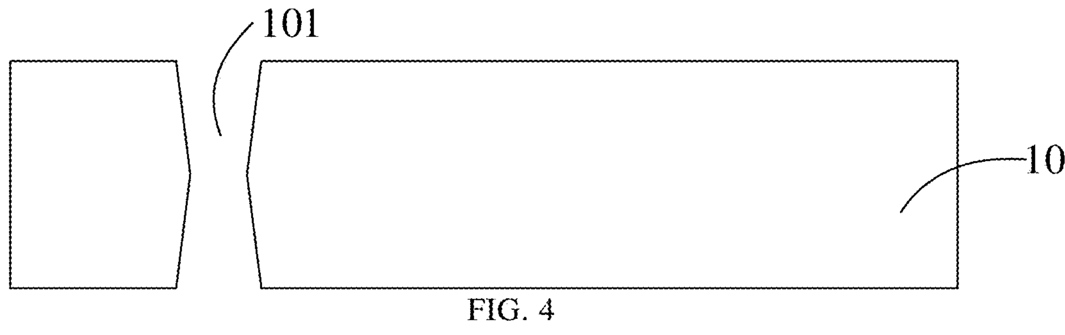
FIG. 4 is a schematic diagram of an intermediate product formed in step S11 of a method for manufacturing a filter according to a first example of an embodiment of the present disclosure.
Figure 5:
FIG. 5 is a schematic diagram of an intermediate product formed in step S12 of a method for manufacturing a filter according to a first example of an embodiment of the present disclosure.
Figure 6:
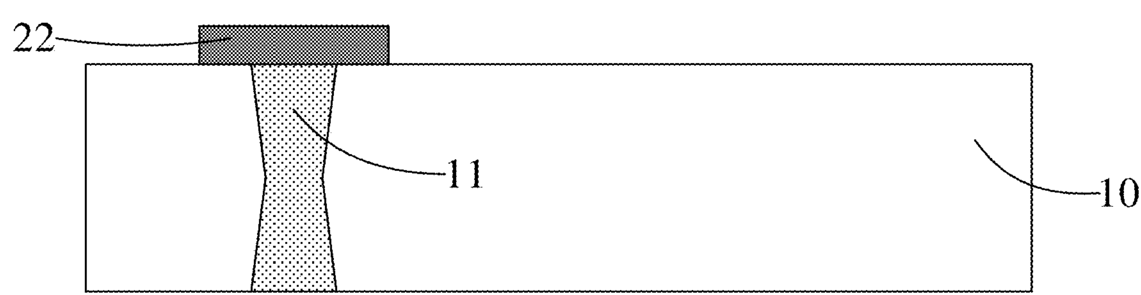
FIG. 6 is a schematic diagram of an intermediate product formed in step S13 of a method for manufacturing a filter according to a first example of an embodiment of the present disclosure.
Figure 7:
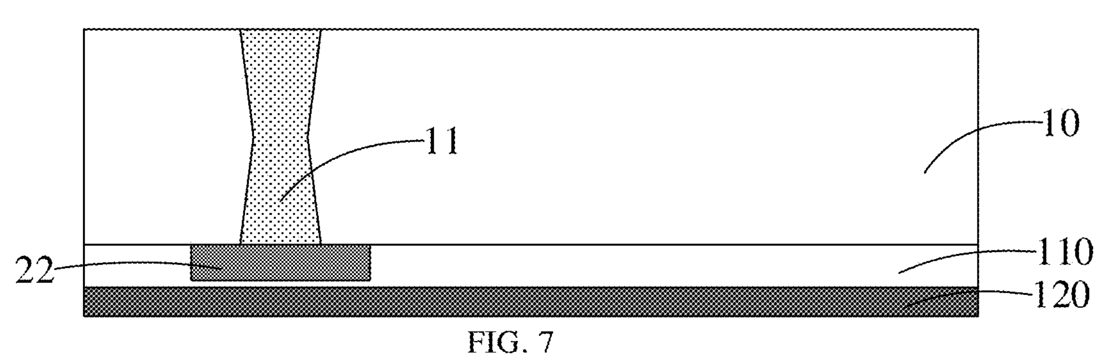
FIG. 7 is a schematic diagram of an intermediate product formed in step S14 of a method for manufacturing a filter according to a first example of an embodiment of the present disclosure.
Figure 8:
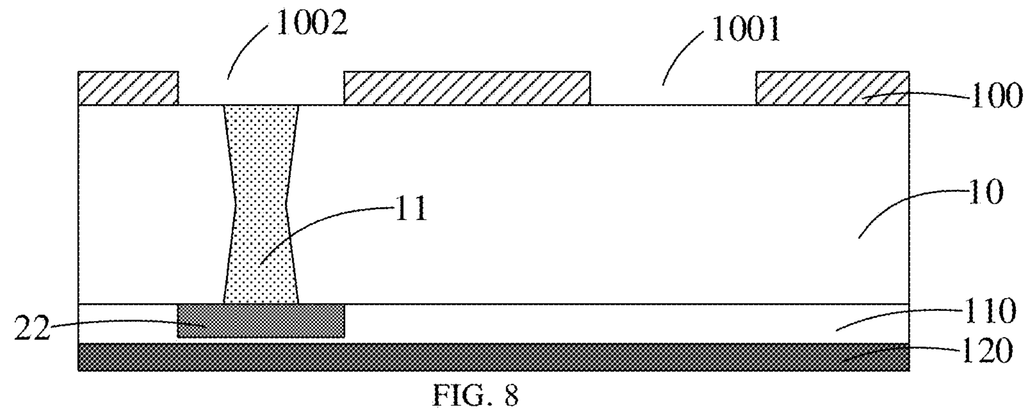
FIG. 8 is a schematic diagram of an intermediate product formed in step S15 of a method for manufacturing a filter according to a first example of an embodiment of the present disclosure.
Figure 9:
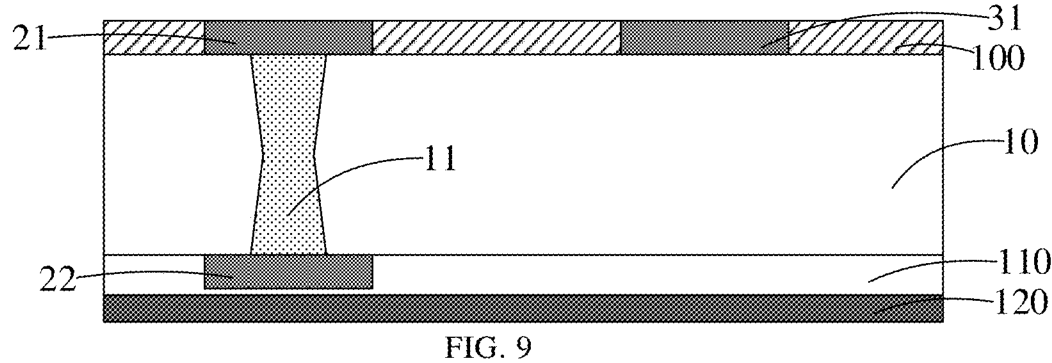
FIG. 9 is a schematic diagram of an intermediate product formed in step S16 of a method for manufacturing a filter according to a first example of an embodiment of the present disclosure.
Figure 10:
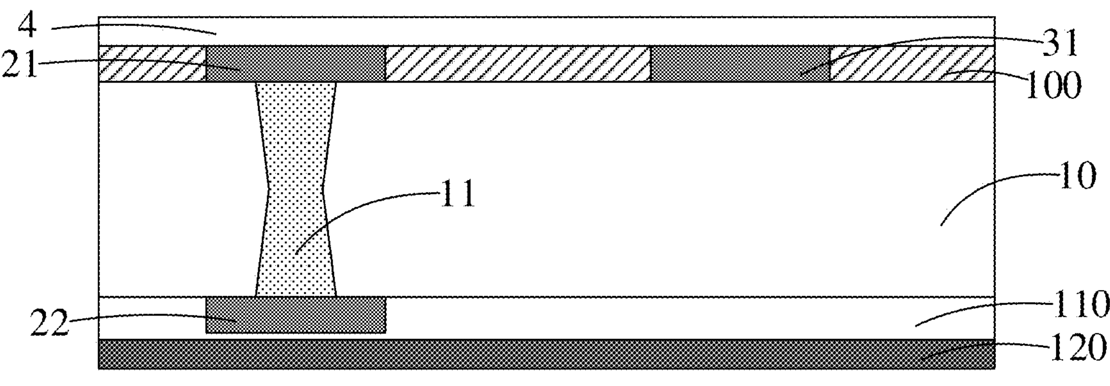
FIG. 10 is a schematic diagram of an intermediate product formed in step S17 of a method for manufacturing a filter according to a first example of an embodiment of the present disclosure.
Figures 11, 12, 13:
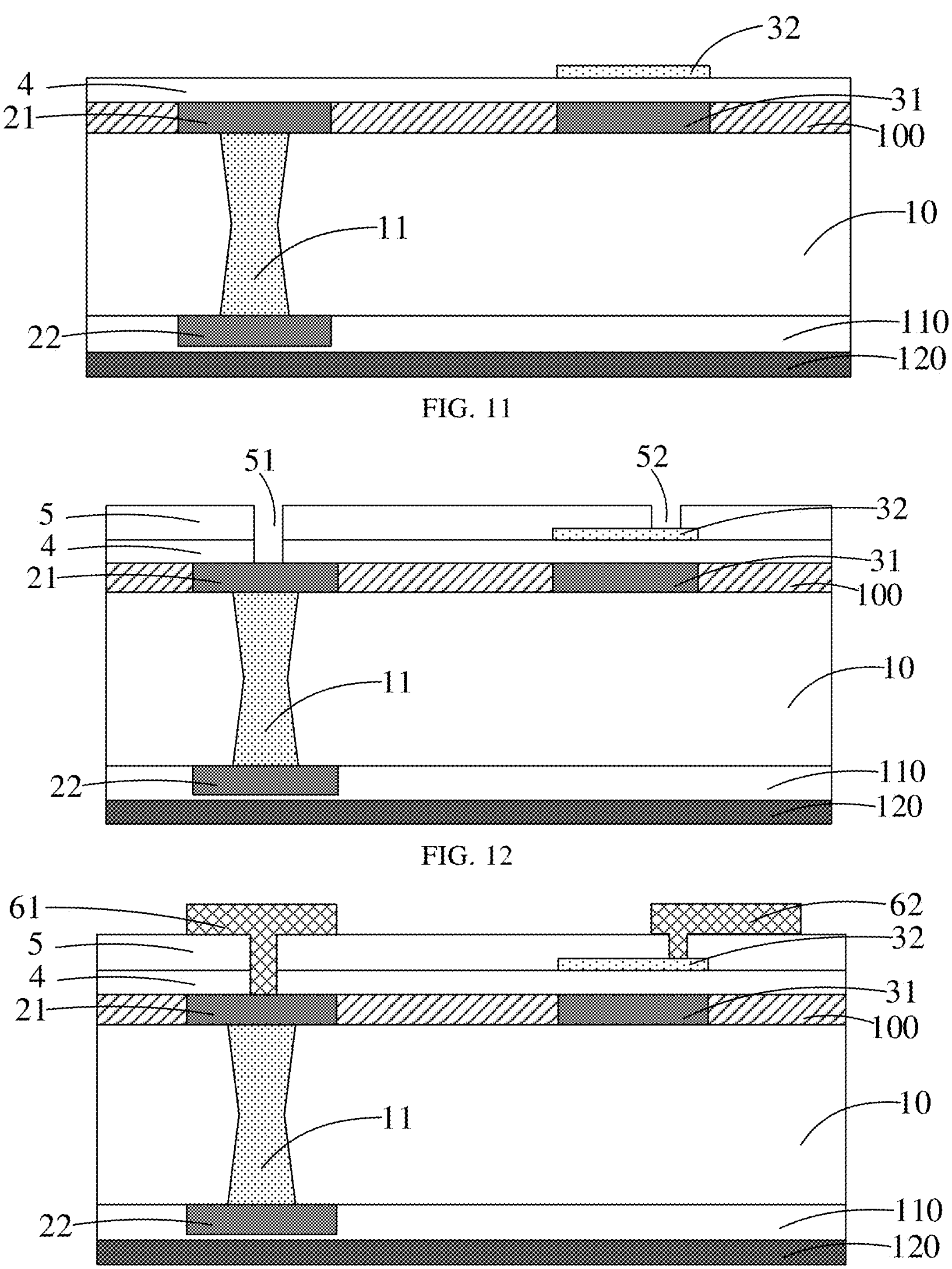
FIG. 11 is a schematic diagram of an intermediate product formed in step S18 of a method for manufacturing a filter according to a first example of an embodiment of the present disclosure.
FIG. 12 is a schematic diagram of an intermediate product formed in step S19 of a method for manufacturing a filter according to a first example of an embodiment of the present disclosure.
FIG. 13 is a schematic diagram of an intermediate product formed in step S110 of a method for manufacturing a filter according to a first example of an embodiment of the present disclosure.
Figures 14, 15, 16:
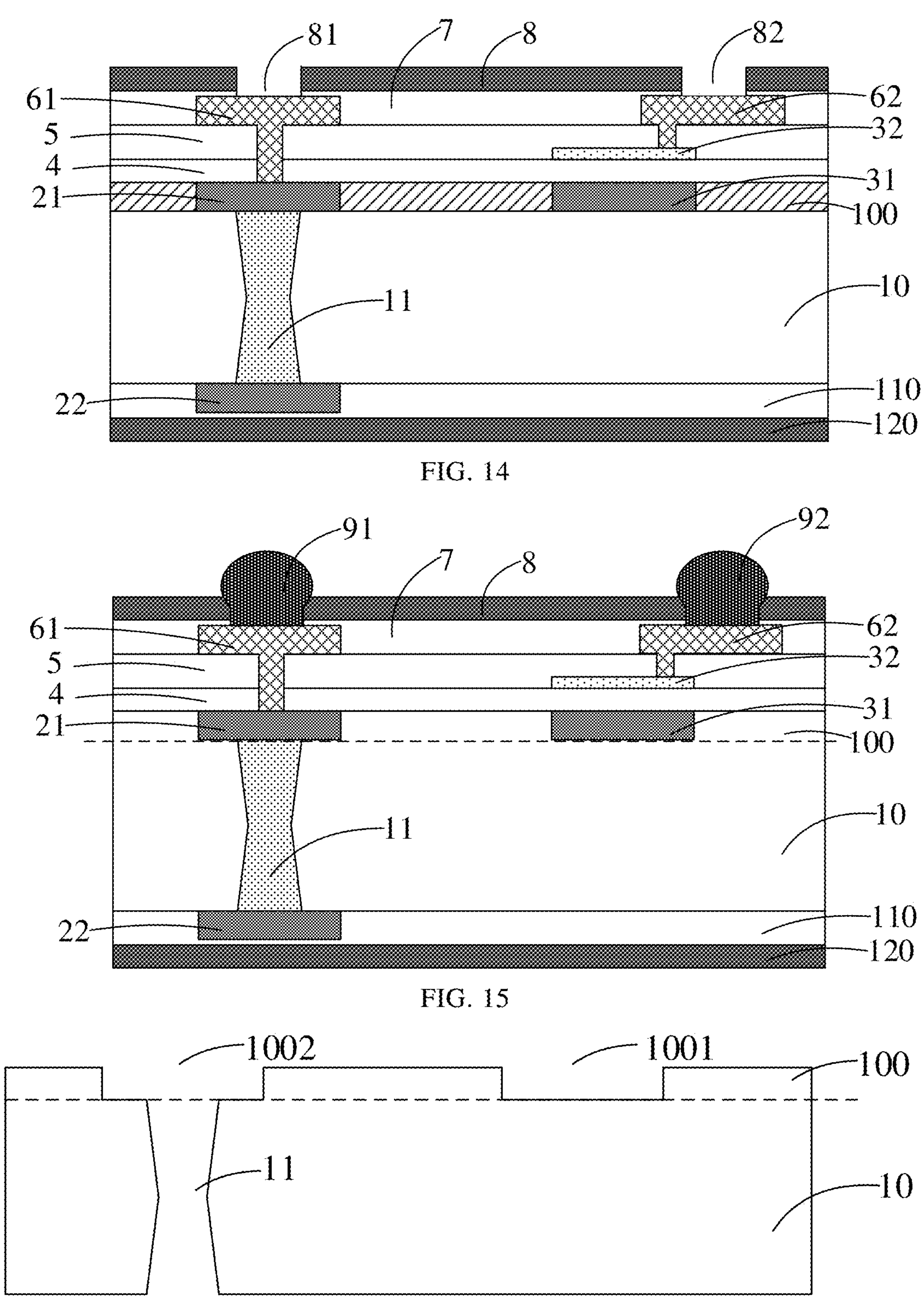
FIG. 14 is a schematic diagram of an intermediate product formed in step S111 of a method for manufacturing a filter according to a first example of an embodiment of the present disclosure.
FIG. 15 is a cross-sectional view of a filter according to a second example of an embodiment of the present disclosure.
FIG. 16 is a cross-sectional view of a dielectric substrate of a filter according to a second example of an embodiment of the present disclosure.

Next, a method for manufacturing a filter in the first example is described. FIG. 4 is a schematic diagram of an intermediate product formed in step S11 of a method for manufacturing a filter according to a first example of an embodiment of the present disclosure. FIG. 5 is a schematic diagram of an intermediate product formed in step S12 of a method for manufacturing a filter according to a first example of an embodiment of the present disclosure. FIG. 6 is a schematic diagram of an intermediate product formed in step S13 of a method for manufacturing a filter according to a first example of an embodiment of the present disclosure. FIG. 7 is a schematic diagram of an intermediate product formed in step S14 of a method for manufacturing a filter according to a first example of an embodiment of the present disclosure. FIG. 8 is a schematic diagram of an intermediate product formed in step S15 of a method for manufacturing a filter according to a first example of an embodiment of the present disclosure. FIG. 9 is a schematic diagram of an intermediate product formed in step S16 of a method for manufacturing a filter according to a first example of an embodiment of the present disclosure. FIG. 10 is a schematic diagram of an intermediate product formed in step S17 of a method for manufacturing a filter according to a first example of an embodiment of the present disclosure. FIG. 11 is a schematic diagram of an intermediate product formed in step S18 of a method for manufacturing a filter according to a first example of an embodiment of the present disclosure. FIG. 12 is a schematic diagram of an intermediate product formed in step S19 of a method for manufacturing a filter according to a first example of an embodiment of the present disclosure. FIG. 13 is a schematic diagram of an intermediate product formed in step S110 of a method for manufacturing a filter according to a first example of an embodiment of the present disclosure. FIG. 14 is a schematic diagram of an intermediate product formed in step S111 of a method for manufacturing a filter according to a first example of an embodiment of the present disclosure. The method specifically includes following steps S11 to S112:

The step S11 includes providing a dielectric substrate 10. The dielectric substrate 10 includes a first surface and a second surface opposite to each other in the thickness direction of the dielectric substrate 10 and is provided with first connection vias 101 penetrating through the dielectric substrate 10 in a thickness direction of the dielectric substrate 10, as shown in FIG. 4

In some examples, the dielectric substrate 10 includes, but is not limited to, the glass substrate, which is taken as an example in the embodiments of the present disclosure. For the first connection vias 101 in the dielectric substrate 10, a via-last process may be performed on the dielectric substrate 10 for forming the first connection vias 101 by using various methods, including, for example: a sand blast method, a photosensitive glass method, a focus discharge method, a plasma etching method, a laser ablation method, an electrochemical method, a laser induced etching method, or the like. Different methods have different advantages and disadvantages, and application scenarios. For example, the sand blast method is a simple process, and the first connection via 101 formed by this method has a larger aperture, so that this method is only suitable for forming the first connection via 101 with the aperture larger than 200 μm. The photosensitive glass method is a simple process and capable of forming the first connection vias 101 with high density and high aspect ratio. The focus discharge method can form the first connection via rapidly. The first connection via formed by the plasma etching method has a small sidewall roughness. The laser ablation method can form the first connection vias 101 with high density and high aspect ratio, but with a high roughness. The electrochemical method is low in cost, is performed by a simple equipment, and can form the first connection via 101 rapidly and can form the first connection via 101 with a larger diameter. The laser induced etching method can form the first connection via rapidly, can form the first connection vias with high density and high aspect ratio, and will not damage inside of the first connection via, but with a disadvantage of an expensive laser equipment. Taking the laser induced etching method as an example, the via-last process may be performed on the back side of the first dielectric substrate 10 by using the laser induced etching method. First, a laser-induced modification is performed on positions where the first connection vias 101 are to be formed by laser, and then the vias are formed by using a wet etching process. The via-last process may be performed only by adopting a single-side etching process, so that each formed via can only be an inverted cone-shaped via, and for the laser induced etching method, the inverted cone-shaped via formed by adopting the single-side etching process is typical characteristics of the first connection via 101 formed on the back side of the first dielectric substrate 10 through the via-last process.

The step S12 includes forming the first connection electrode 11 in each first connection via 101, as shown in FIG. 5.

In some examples, in the step S12, an auxiliary film layer is formed through a process including, but not limited to, a magnetron sputtering process, and then the fifth conductive film layer is continuously sputtered, the fifth conductive film layer is used as a seed layer, the seed layer is electroplated, and after the electroplating is completed, the excess electroplated copper on a second surface is removed by using a chemical mechanical polishing (CMP) method, thereby forming the first connection electrodes 11 for filling the first connection vias 101.

The auxiliary film layer serves to increase the adhesion of the fifth conductive film layer. A material of the auxiliary film layer includes, but is not limited to, titanium (Ti), and a material of the fifth conductive film layer includes, but is not limited to, Cu. A thickness of the auxiliary film layer is in a range from about 10 nm to about 300 nm, and a thickness of the fifth conductive film layer is in a range from about 30 nm to about 100 nm.

The step S13 includes forming a second conductive structure 22 on the second surface of the dielectric substrate 10, as shown in FIG. 6.

In some examples, the step S13 may include: sequentially forming a second auxiliary film layer and a second conductive film layer as a second seed layer on the second surface of the dielectric substrate 10 through a process including, but not limited to, a magnetron sputtering process, and then electroplating the second seed layer, and then patterning the second seed layer to form the second conductive structure 22 of the inductor. A thickness of the electroplated second seed layer is usually greater than 5 μm.

The second auxiliary film layer may be a molybdenum (Mo) and nickel (Ni) alloy layer, and have a thickness is in a range from about 0.03 μm to about 0.05 μm; the second conductive film layer may be a copper (Cu) layer with a thickness in a range from about 0.3 μm to about 0.5 μm. The second auxiliary film layer is provided to increase the adhesion of the second conductive film layer.

The step S14 includes sequentially forming a second protective layer 110 and a second planarization layer 120 by deposition through standard processes such as a PECVD (Plasma Enhanced Chemical Vapor Deposition) process, as shown in FIG. 7.

The second protective layer 110 is used to prevent water and oxygen from invading the devices formed on the first surface of the dielectric substrate 10. A thickness of the second protective layer 110 is in a range from 0.4 μm to 0.6 μm. A thickness of the second planarization layer 120 is 2 μm or more.

The step S15 includes turning over the dielectric substrate 10, and forming a first auxiliary functional layer 100 on the first surface of the dielectric substrate 10. The first auxiliary functional layer 100 is provided with a first accommodating portion 1001 and a second accommodating portion 1002 penetrating through the first auxiliary functional layer 100 in a thickness direction of the first auxiliary functional layer 100, as shown in FIG. 8.

In some examples, the step S15 may include forming the first auxiliary functional layer 100 by deposition through a standard process such as a PECVD process and forming the first accommodating portion 1001 and the second accommodating portion 1002 by an etching process. A thickness of the first auxiliary functional layer 100 is in a range from about 2 μm to about 5 μm, which is the same as the thickness of the first conductive structure 21 of the inductor and the first plate 31 of the capacitor to be formed.

The step S16 includes forming the first plate 31 of the capacitor and the first conductive structure 21 of the inductor in the first accommodating portion 1001 and the second accommodating portion 1002 of the first auxiliary functional layer, respectively, as shown in FIG. 9.

In some examples, the step S16 may include sequentially forming a first auxiliary film layer and a first conductive film layer as a first seed layer through a process including, but not limited to, a magnetron sputtering process, electroplating the first seed layer, and then polishing the first seed layer through a CMP process, so that only the metal materials in the first accommodating portion 1001 and the second accommodating portion 1002 are left, thereby forming the first plate 31 of the capacitor and the first conductive structure 21 of the inductor.

The auxiliary film layer serves to increase the adhesion of the first conductive film layer. A material of the first auxiliary film layer includes, but is not limited to, titanium (Ti), and a material of the first conductive film layer includes, but is not limited to, Cu. A thickness of the first auxiliary film layer is in a range from about 50 nm to about 150 nm, and a thickness of the first conductive film layer is in a range from about 200 nm to about 500 nm.

The step S17 includes forming a first interlayer dielectric layer 4 on a side of the first conductive structure 21 of the inductor and the first plate 31 of the capacitor away from the dielectric substrate 10, as shown in FIG. 10.

In some examples, in the step S17, the first interlayer dielectric layer 4 may be formed by deposition through a standard process such as a Plasma Enhanced Chemical Vapor Deposition (PECVD) process.

The step S18 includes forming a second plate 32 of the capacitor on a side of the first interlayer dielectric layer 4 away from the dielectric substrate 10, as shown in FIG. 11.

In some examples, the step S18 may include sequentially depositing a first film sub-layer, a second film sub-layer, and a third film sub-layer through a process including, but not limited to, a magnetron sputtering process, and then spin-coating a photoresist on a surface of the third film sub-layer away from the dielectric substrate 10, exposing the photoresist by using a corresponding mask, so that the photoresist irradiated by ultraviolet light is modified; and performing the development process on the modified photoresist for removing the modified photoresist, etching copper away in the region which is not protected by the photoresist by using an etching solution for copper to form the second plate 32 including first, second, and third sub-structures arranged in a stack.

The first film sub-layer may be a molybdenum (Mo), nickel (Ni) and titanium (Ti) alloy layer, and have a thickness is in a range from about 0.03 μm to about 0.05 μm; the second film sub-layer may be a copper (Cu) layer with a thickness in a range from about 0.3 μm to about 0.5 μm. The third film sub-layer may be a Mo, Ni and Ti alloy layer, and have a thickness is in a range from about 0.02 μm to about 0.05 μm.

The step S19 includes forming a second interlayer dielectric layer 5 on a side of the second plate 32 of the capacitor away from the dielectric substrate 10, forming a second connection via 51 penetrating through the first interlayer dielectric layer 4 and the second interlayer dielectric layer 5, and forming a third connection via 52 penetrating through the second interlayer dielectric layer 5, as shown in FIG. 12.

In some examples, the step S19 may include forming the second interlayer dielectric layer 5 by deposition through a standard process such as a PECVD process, and forming the second connection via 51 penetrating through the first interlayer dielectric layer 4 and the second interlayer dielectric layer 5, and the third connection via 52 penetrating through the second interlayer dielectric layer 5 by dry etching.

The step S110 includes forming a second connection electrode 61 and a third connection electrode 62 on a side of the second interlayer dielectric layer 5 away from the dielectric substrate 10, as shown in FIG. 13.

In some examples, the step S110 may include sequentially forming a third auxiliary film layer and a fourth conductive film layer as a second seed layer on a side of the second interlayer dielectric layer 5 away from the dielectric substrate 10 through a process including, but not limited to, a magnetron sputtering process, electroplating the second seed layer, and then patterning the fourth conductive film layer and the third auxiliary film layer that becomes thicker by electroplating to form the second connection electrode 61 and the third connection electrode 62. The second connection electrode 61 is connected to the inductor through the second connection via 51, and the third connection electrode 62 is connected to the second plate 32 of the capacitor through the third connection via 52.

The third auxiliary film layer may be a molybdenum (Mo) and nickel (Ni) alloy layer, and have a thickness in a range from about 0.03 μm to about 0.05 μm; the fourth conductive film layer may be a copper (Cu) layer with a thickness in a range from about 0.3 μm to about 0.5 μm. The third auxiliary film layer is disposed to increase the adhesion of the fourth conductive film layer.

The step S111 includes sequentially forming a first protective layer 7 and a first planarization layer 8 on a side of the second connection electrode 61 and the third connection electrode 62 away from the dielectric substrate 10 by deposition, and forming a fourth connection via 81 and a fifth connection via 82 penetrating through the first protective layer 7 and the first planarization layer 8 through an etching process, as shown in FIG. 14.

The first protective layer 7 is used for preventing water and oxygen from invading the devices formed on the first surface of the dielectric substrate 10. A thickness of the first protective layer 7 is in a range from 0.4 μm to 0.6 μm; a thickness of the first planarization layer 8 is 2 μm or more.

The step S112 includes forming a first connection pad 91 and a second connection pad 92. The first connection pad 91 is connected to the second connection electrode 61 through the fourth connection via 81, and the second connection pad 92 is connected to the third connection electrode 62 through the fifth connection via 82, as shown in FIG. 3.

The fabrication of the filter according to an embodiment of the present disclosure is thus completed.

In a second example, FIG. 15 is a cross-sectional view of a filter according to a second example of an embodiment of the present disclosure. FIG. 16 is a cross-sectional view of a dielectric substrate 10 of a filter according to a second example of an embodiment of the present disclosure. As shown in FIGS. 15 and 16, the filter has substantially the same structure as that in the first example, except that the first auxiliary functional layer 100 and the dielectric substrate 10 have a one-piece structure in the second example. That is, a material of the first auxiliary functional layer 100 is the glass substrate. In other words, the dielectric substrate 10 includes a first portion, a second portion, and a third portion stacked sequentially in a direction from the first surface to the second surface of the dielectric substrate 10; the third portion of the dielectric substrate 10 serves as the first auxiliary functional layer 100. At this time, the third portion of the dielectric substrate 10 is provided with the first accommodating portion 1001 and the second accommodating portion 1002 penetrating through the third portion in a thickness direction of the third portion. The first plate 31 of the capacitor fills in the first accommodating portion 1001 and the first conductive structure 21 of the inductor fills in the second accommodating portion 1002. In addition, the first conductive structure 21 of the inductor is electrically connected to the second conductive structure 22 necessarily through the first connection electrode 11 disposed in the first connection via 101. Therefore, it can be understood that an orthographic projection of the second accommodating portion 1002 on a plane where the first surface of the dielectric substrate 10 is located at least partially overlaps with an orthographic projection of the first connection via 101 on the plane where the first surface of the dielectric substrate 10 is located.

The remaining structure of the filter in the second example may be the same as that in the first example, and therefore, the description thereof is not repeated here.

Figure 17:
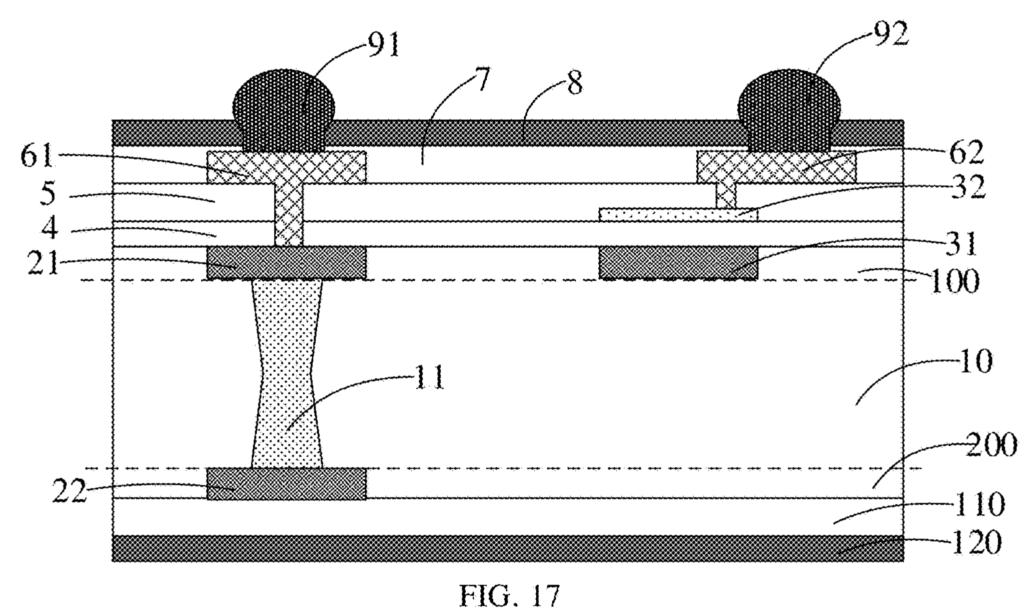
FIG. 17 is a cross-sectional view of a filter according to a third example of an embodiment of the present disclosure.
Figure 18:
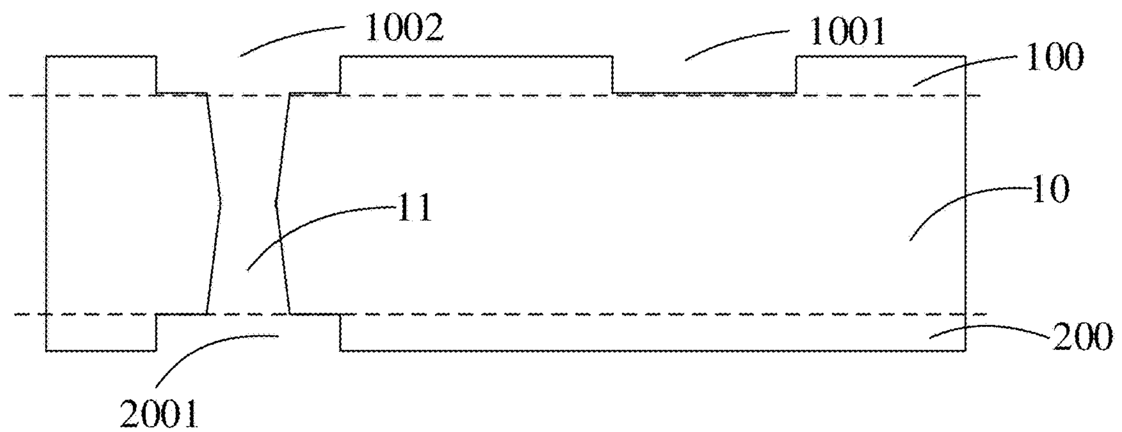
FIG. 18 is a sectional view of a dielectric substrate of a filter according to a third example of the embodiment of the present disclosure.

In a third example, FIG. 17 is a cross-sectional view of a filter according to a third example of an embodiment of the present disclosure. FIG. 18 is a sectional view of a dielectric substrate 10 of a filter according to a third example of the embodiment of the present disclosure. As shown in FIGS. 17 and 18, the filter in the third example has substantially the same structure as that in the second example, except that the filter in the third example includes not only the first auxiliary functional layer 100 having a one-piece structure with the dielectric substrate 10, but also a second auxiliary functional layer 200 having a one-piece structure with the dielectric substrate 10, and the second auxiliary functional layer 200 includes a third accommodating portion 2001, and the second conductive structure 22 of the inductor fills in the second accommodating portion 1002. That is, a material of the second auxiliary functional layer is the glass substrate. In other words, the dielectric substrate 10 includes a first portion, a second portion, and a third portion stacked sequentially in a direction from the first surface to the second surface of the dielectric substrate 10; the first portion of the dielectric substrate 10 serves as the second auxiliary functional layer 200, and the third portion of the dielectric substrate 10 serves as the first auxiliary functional layer 100. At this time, the first portion of the dielectric substrate 10 is provided with the third accommodating portion 2001 penetrating through the first portion in a thickness direction of the first portion, and the third portion of the dielectric substrate 10 is provided with the first accommodating portion 1001 and the second accommodating portion 1002 penetrating through the third portion in a thickness direction of the third portion. The first plate 31 of the capacitor fills in the first accommodating portion 1001, the first conductive structure 21 of the inductor fills in the second accommodating portion 1002, and the second conductive structure 22 of the inductor fills in the third accommodating portion 2001. In addition, the first conductive structure 21 of the inductor is electrically connected to the second conductive structure 22 necessarily through the first connection electrode 11 disposed in the first connection via 101. Therefore, it can be understood that an orthographic projection of the second accommodating portion 1002 on a plane where the first surface of the dielectric substrate 10 is located at least partially overlaps with an orthographic projection of the first connection via 101 on the plane where the first surface of the dielectric substrate 10 is located, and an orthographic projection of the third accommodating portion 2001 on the plane where the first surface of the dielectric substrate 10 is located at least partially overlaps with the orthographic projection of the first connection via 101 on the plane where the first surface of the dielectric substrate 10 is located.

The remaining structure of the filter in the third example may be the same as that in the second example, and therefore, the description thereof is not repeated.

Figure 19:
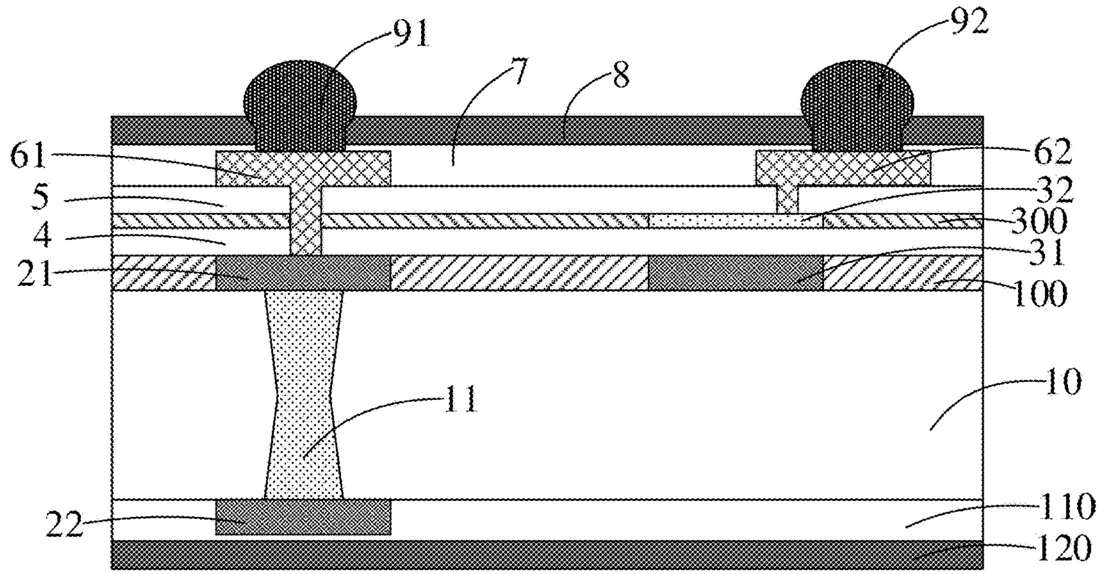
FIG. 19 is a cross-sectional view of a filter according to a fourth example of an embodiment of the present disclosure.

In a fourth example, FIG. 19 is a cross-sectional view of a filter according to a fourth example of an embodiment of the present disclosure. As shown in FIG. 19, the filter in the fourth example has a structure substantially the same as that in the first example, except that in the fourth example, a third auxiliary functional layer 300 is formed on a side of the first interlayer dielectric layer 4 away from the dielectric substrate 10, and is provided with a fourth accommodating portion penetrating through the third auxiliary functional layer 300 in a thickness direction of the third auxiliary functional layer 300. The second plate 32 fills in the fourth accommodating portion, and a surface of the second plate 32 away from the dielectric substrate 10 is flush with a surface of the third auxiliary functional layer 300 away from the dielectric substrate 10. In this case, a third conductive film layer is formed on a side of the third auxiliary functional layer 300 away from the dielectric substrate 10, and then with the third auxiliary functional layer 300 as a reference, the third conductive film layer is polished through the CMP process to form the second plate 32 of the capacitor, so that a surface of the formed second plate 32 is smooth, and therefore, subsequently formed film layers are smooth.

The remaining structure of the filter in the fourth example may be the same as that in the first example, and therefore, the description thereof is not repeated here.

Figure 20:
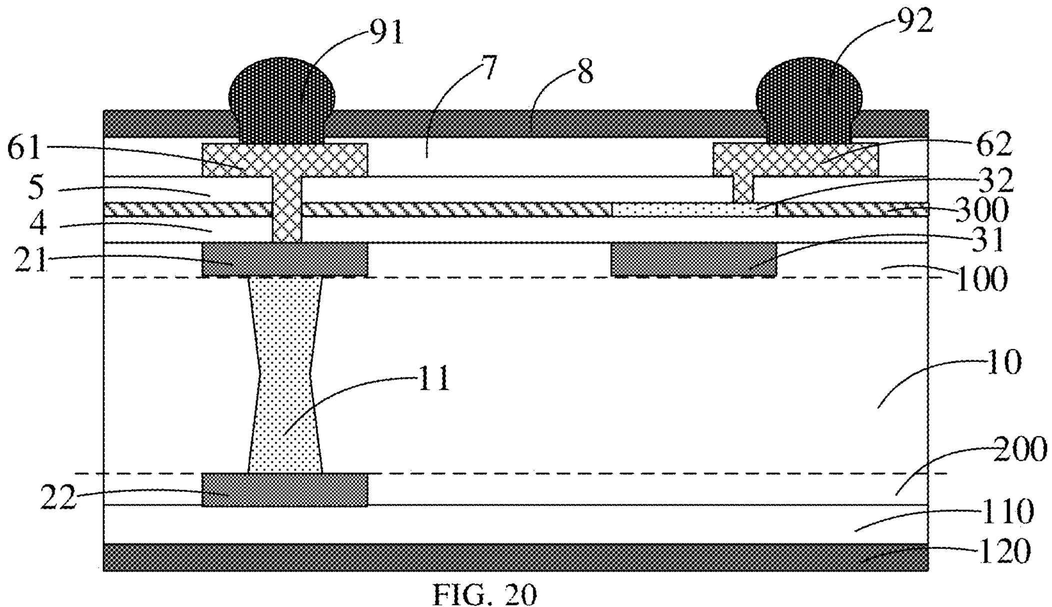
FIG. 20 is a cross-sectional view of a filter according to a fifth example of an embodiment of the present disclosure.

In a fifth example, FIG. 20 is a cross-sectional view of a filter according to a fifth example of an embodiment of the present disclosure. As shown in FIG. 20, the filter in the fifth example has a structure substantially the same as that in the third example, except that in the fifth example, a third auxiliary functional layer 300 is formed on a side of the first interlayer dielectric layer 4 away from the dielectric substrate 10, and is provided with a fourth accommodating portion penetrating through the third auxiliary functional layer 300 in a thickness direction of the third auxiliary functional layer 300. The second plate 32 fills in the fourth accommodating portion, and a surface of the second plate 32 away from the dielectric substrate 10 is flush with a surface of the third auxiliary functional layer 300 away from the dielectric substrate 10. In this case, a third conductive film layer is formed on a side of the third auxiliary functional layer 300 away from the dielectric substrate 10, and then with the third auxiliary functional layer 300 as a reference, the third conductive film layer is polished through the CMP process to form the second plate 32 of the capacitor, so that a surface of the formed second plate 32 is smooth, and therefore, subsequently formed film layers are smooth.

The remaining structure of the filter in the fifth example may be the same as that in the third example, and therefore, the description thereof is not repeated.

An embodiment of the present disclosure provides an electronic apparatus, which may include the filter in any one of the embodiments.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A filter, comprising a dielectric substrate, at least one inductor and at least one capacitor integrated on the dielectric substrate; wherein the dielectric substrate comprises a first connection via penetrating through the dielectric substrate in a thickness direction of the dielectric substrate, each of the at least one inductor comprises a first conductive structure, a second conductive structure, and a first connection electrode, the first conductive structure and the second conductive structure are respectively located on two opposite sides of the dielectric substrate in the thickness direction of the dielectric substrate, the first connection electrode is in a corresponding first connection via, the first conductive structure is electrically connected to the second conductive structure through the first connection electrode to form a coil structure of each of the at least one the inductor, each of the at least one capacitor comprises a first plate and a second plate, the first plate and the first conductive structure are in a same layer, and the second plate is on a side of the first plate away from the dielectric substrate; and the filter further comprises a first auxiliary functional layer on a side of the dielectric substrate away from the second conductive structure, the first auxiliary functional layer comprises a first accommodating portion and a second accommodating portion penetrating through the first auxiliary functional layer in a thickness direction of the first auxiliary functional layer, the first plate fills in the first accommodating portion, the first conductive structure fills in the second accommodating portion, and a surface of each of the first plate and the first conductive structure away from the dielectric substrate is flush with a surface of the first auxiliary functional layer away from the dielectric substrate.

2. The filter according to claim 1, wherein the first auxiliary functional layer is made of an inorganic insulating material.

3. The filter according to claim 1, wherein the first auxiliary functional layer and the dielectric substrate have a one-piece structure.

4. The filter according to claim 1, further comprising a second auxiliary functional layer on a side of the dielectric substrate away from the first conductive structures, wherein the second auxiliary functional layer comprises a third accommodating portion penetrating through the second auxiliary functional layer in a thickness direction of the second auxiliary functional layer, the second conductive structure fills in the third accommodating portion, and a surface of the second conductive structure away from the dielectric substrate is flush with a surface of the second auxiliary functional layer away from the dielectric substrate.

5. The filter according to claim 4, wherein the second auxiliary functional layer is made of an inorganic insulating material, and the dielectric substrate comprises a glass substrate.

6. The filter according to claim 4, wherein the second auxiliary functional layer and the dielectric substrate have a one-piece structure.

7. The filter according to claim 1, further comprising a first interlayer dielectric layer between a layer on which the first plate is located and a layer on which the second plate is located, and a third auxiliary functional layer on a side of the first interlayer dielectric layer away from the dielectric substrate, wherein the third auxiliary functional layer comprises a fourth accommodating portion penetrating through the third auxiliary functional layer in a thickness direction of the third auxiliary functional layer, the second plate fills in the fourth accommodating portion, and a surface of the second plate away from the dielectric substrate is flush with a surface of the third auxiliary functional layer away from the dielectric substrate.

8. The filter according to claim 1, further comprising a second interlayer dielectric layer on a side of the second plate of the capacitor away from the dielectric substrate, and a second connection electrode and a third connection electrode on a side of the second interlayer dielectric layer away from the dielectric substrate, wherein the second connection electrode is electrically connected to the inductor through a second connection via, and the third connection electrode is electrically connected to the second plate of the capacitor through a third connection via.

9. The filter according to claim 8, further comprising a first protective layer and a first planarization layer sequentially arranged on a side of the second connection electrode and the third connection electrode away from the dielectric substrate, a first connection pad electrically connected to the second connection electrode through a fourth connection via, and a second connection pad electrically connected to the third connection electrode through a fifth connection via, wherein the fourth connection via and the fifth connection via penetrate through the first protective layer and the first planarization layer.

10. The filter according to claim 1, further comprising a second protective layer and a second planarization layer sequentially arranged on a side of the second conductive structures away from the dielectric substrate.

11. A method for manufacturing a filter, comprising: providing a dielectric substrate, and integrating at least one inductor and at least one capacitor on the dielectric substrate, wherein the dielectric substrate comprises a first connection via penetrating through the dielectric substrate in a thickness direction of the dielectric substrate, and wherein the integrating at least one inductor and at least one capacitor on the dielectric substrate, comprises:

forming a first auxiliary functional layer on the dielectric substrate, wherein the first auxiliary functional layer comprises a first accommodating portion and a second accommodating portion penetrating through the first auxiliary functional layer in a thickness direction of the first auxiliary functional layer; and forming a first connection electrode of each of the at least one inductor in the first connection vias, forming a first conductive film layer on a side of the dielectric substrate away from the first auxiliary functional layer, polishing the first conductive film layer through a CMP process to form a first conductive structure of each of the at least one inductor and a first plate of each of the at least one capacitor, and forming a second conductive structure of each of the at least one inductor on a side of the dielectric substrate away from the first conductive structure, wherein the first conductive structure is electrically connected to the second conductive structure through the first connection electrode to form a coil structure of each of the at least one inductor, the first plate fills in the first accommodating portion, the first conductive structure fills in the second accommodating portion, and a surface of each of the first plate and the first conductive structure away from the dielectric substrate is flush with a surface of the first auxiliary functional layer away from the dielectric substrate.

12. The method according to claim 11, wherein the first auxiliary functional layer and the dielectric substrate have a one-piece structure.

13. The method according to claim 11, further comprising forming a second auxiliary functional layer on a side of the dielectric substrate away from the first conductive structures, wherein the second auxiliary functional layer comprises a third accommodating portion penetrating through the second auxiliary functional layer in a thickness direction of the second auxiliary functional layer, the second conductive structure fills in the third accommodating portion, and a surface of the second conductive structure away from the dielectric substrate is flush with a surface of the second auxiliary functional layer away from the dielectric substrate.

14. The method according to claim 13, wherein the second auxiliary functional layer is made of an inorganic insulating material, and the first auxiliary functional layer is made of an inorganic insulating material.

15. The method according to claim 13, wherein the second auxiliary functional layer and the dielectric substrate have a one-piece structure, and the dielectric substrate comprises a glass substrate.

16. The method according to claim 11, wherein forming the at least one capacitor further comprises sequentially forming a first interlayer dielectric layer and a second plate on a layer on which the first plate is located, and the method further comprises, prior to the forming the second plate:

forming a third auxiliary functional layer on a side of the first interlayer dielectric layer away from the dielectric substrate, wherein the third auxiliary functional layer comprises a fourth accommodating portion penetrating through the third auxiliary functional layer in a thickness direction of the third auxiliary functional layer, the second plate fills in the fourth accommodating portion, and a surface of the second plate away from the dielectric substrate is flush with a surface of the third auxiliary functional layer away from the dielectric substrate.

17. The method according to claim 11, further comprising: forming a second interlayer dielectric layer on a side of the second plate of the capacitor away from the dielectric substrate, and forming a second connection electrode and a third connection electrode on a side of the second interlayer dielectric layer away from the dielectric substrate, wherein the second connection electrode is electrically connected to the inductor through a second connection via, and the third connection electrode is electrically connected to the second plate of the capacitor through a third connection via.

18. The method according to claim 17, further comprising: sequentially forming a first protective layer and a first planarization layer on a side of the second connection electrode and the third connection electrode away from the dielectric substrate, wherein a first connection pad is electrically connected to the second connection electrode through a fourth connection via, and a second connection pad is electrically connected to the third connection electrode through a fifth connection via; and the fourth connection via and the fifth connection via penetrate through the first protective layer and the first planarization layer.

19. The method according to claim 11, further comprising sequentially forming a second protective layer and a second planarization layer on a side of the second conductive structures away from the dielectric substrate.

20. An electronic apparatus, comprising the filter according to claim 1.

* * * * *